United States Patent
Yang et al.

(10) Patent No.: US 9,780,256 B2
(45) Date of Patent: Oct. 3, 2017

(54) METHOD AND STRUCTURE OF PROMOTING POSITIVE EFFICIENCY AGING AND STABILIZATION OF QUANTUM DOT LIGHT-EMITTING DIODE

(71) Applicant: NANOPHOTONICA, INC., Orlando, FL (US)

(72) Inventors: Yixing Yang, Gainesville, FL (US); Alexandre Titov, Gainesville, FL (US); Jake Hyvonen, Gainesville, FL (US); Ying Zheng, Gainesville, FL (US); Lei Qian, Gainesville, FL (US); Paul H. Holloway, Orlando, FL (US)

(73) Assignee: NanoPhotonica, Orlando, FL (US)

( * ) Notice: Subject to any disclaimer, the term of this patent is extended or adjusted under 35 U.S.C. 154(b) by 0 days.

(21) Appl. No.: 15/103,680

(22) PCT Filed: Dec. 10, 2014

(86) PCT No.: PCT/US2014/069479
§ 371 (c)(1),
(2) Date: Jun. 10, 2016

(87) PCT Pub. No.: WO2015/089145
PCT Pub. Date: Jun. 18, 2015

(65) Prior Publication Data
US 2016/0315217 A1    Oct. 27, 2016

Related U.S. Application Data

(60) Provisional application No. 61/915,268, filed on Dec. 12, 2013.

(51) Int. Cl.
*H01L 33/06*    (2010.01)
*H01L 33/56*    (2010.01)
(Continued)

(52) U.S. Cl.
CPC ........... *H01L 33/06* (2013.01); *H01L 33/005* (2013.01); *H01L 33/56* (2013.01); *H05B 33/04* (2013.01);
(Continued)

(58) Field of Classification Search
CPC ............................... H01L 33/06; H01L 33/56
See application file for complete search history.

(56) References Cited

U.S. PATENT DOCUMENTS 6,322,901 B1    11/2001  Bawendi
6,576,291 B2     6/2003  Bawendi
(Continued)

FOREIGN PATENT DOCUMENTS

JP   2010-219551 A    9/2010
KR   10-2012-0009686 A    2/2012
(Continued)

OTHER PUBLICATIONS

International Search Report and Written Opinion for Application No. PCT/US2014/069479 mailed Mar. 31, 2015.
(Continued)

*Primary Examiner* — Daniel Shook
(74) *Attorney, Agent, or Firm* — Wolf, Greenfield & Sacks, P.C.

(57) ABSTRACT

A method for synthesizing a quantum dot light emitting diode by providing a glass substrate. A QD-LED stack is formed upon the glass substrate. This QD-LED stack is diffused with an active reagent. The QD-LED stack is encapsulated with a curable resin. The curable resin is cured with UV light.

20 Claims, 15 Drawing Sheets

(51) Int. Cl.
*H05B 33/04* (2006.01)
*H01L 33/00* (2010.01)
*H01L 51/50* (2006.01)
*H01L 51/52* (2006.01)

(52) U.S. Cl.
CPC ........ *H01L 51/502* (2013.01); *H01L 51/5246* (2013.01); *H01L 2933/005* (2013.01)

(56) References Cited

U.S. PATENT DOCUMENTS

| | | |
|---|---|---|
| 2008/0182105 A1 | 7/2008 | Wang et al. |
| 2009/0109435 A1 | 4/2009 | Kahen et al. |
| 2009/0278141 A1 | 11/2009 | Coe-Sullivan et al. |
| 2010/0140586 A1 | 6/2010 | Char et al. |
| 2012/0138894 A1 | 6/2012 | Qian |
| 2012/0195340 A1 | 8/2012 | Cheon et al. |
| 2013/0069036 A1* | 3/2013 | Miyata ............ B82Y 20/00 257/13 |
| 2013/0175558 A1 | 7/2013 | Orsley et al. |
| 2016/0233378 A1 | 8/2016 | Titov et al. |

FOREIGN PATENT DOCUMENTS

| | | |
|---|---|---|
| KR | 10-2013-0043294 A | 4/2013 |
| WO | WO 2011/088159 A1 | 7/2011 |

OTHER PUBLICATIONS

International Search Report and Written Opinion dated Jan. 15, 2015 in connection with Application No. PCT/US2014/060866.

Extended European Search Report and European Search Opinion dated Mar. 1, 2017 in connection with Application No. 14853330.0.

Chin et al., Energy transfer in hybrid quantum dot light-emitting diodes. Journal of Applied Physics. Jul. 7, 2008;104:013108. doi: http://dx.doi.org/10.1063/1.2932149.

Colvin et al., Light-emitting diodes made from cadmium selenide nanocrystals and a semiconducting polymer. Nature. Aug. 4, 1994;370:354-7. doi:10.1038/370354a0.

Hikmet et al., Polarized-Light-Emitting Quantum-Rod Diodes. Adv. Mater. Jun. 6, 2005;17(11): 1436-9. doi:10.1002/adma.200401763. Epub May 24, 2005.

Zhang et al., Scalable single-step noninjection synthesis of high-quality core/shell quantum dots with emission tunable from violet to near infrared. ACS Nano. Dec. 21, 2012;6(12):11066-73. doi: 10.1021/nn304765k. Epub Dec 12, 2012.

* cited by examiner

T50 lifetime for device encapsulated by Loctite 349: ~320 hrs
T50 lifetime for device encapsulated by OG 142: <100hrs

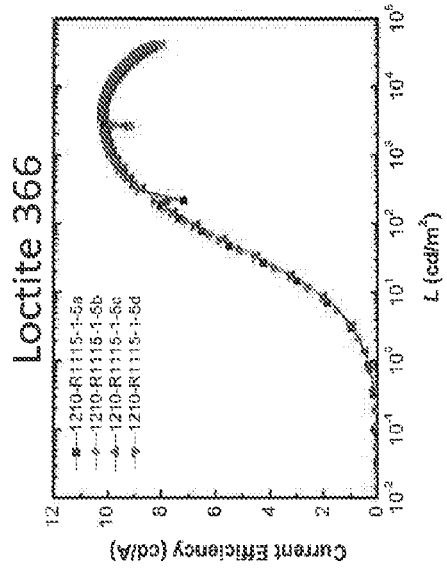
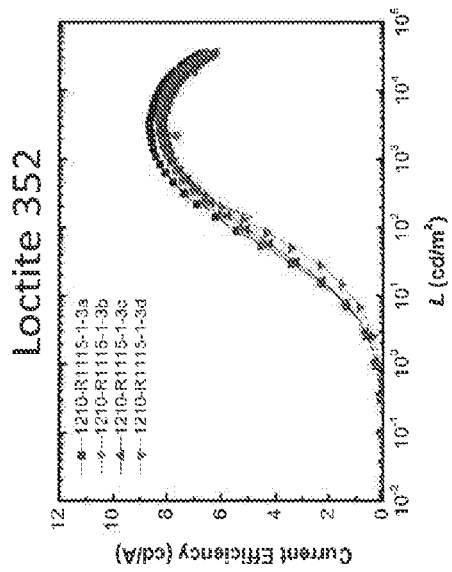
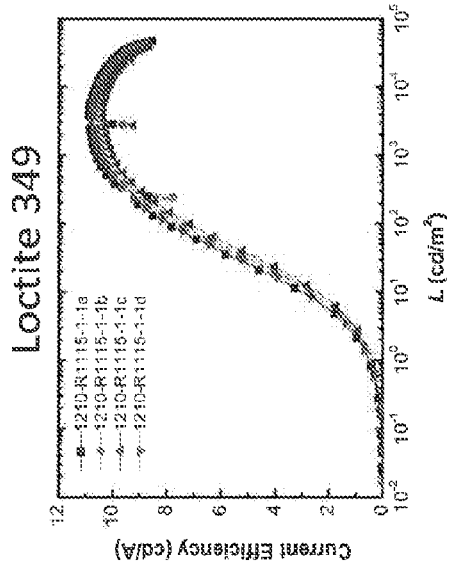
Fig. 6a
Fig. 6b
Fig. 6c

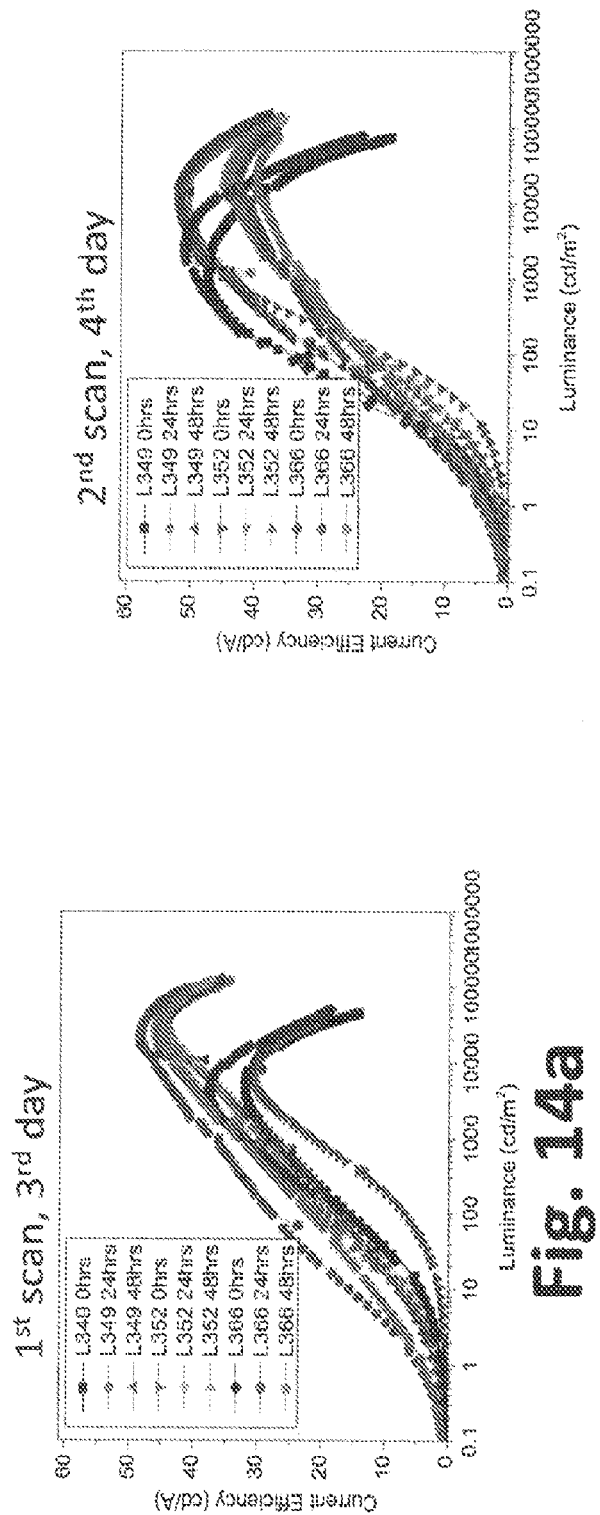

US 9,780,256 B2

METHOD AND STRUCTURE OF PROMOTING POSITIVE EFFICIENCY AGING AND STABILIZATION OF QUANTUM DOT LIGHT-EMITTING DIODE

RELATED APPLICATIONS

This application is the National Phase under 35 U.S.C. §371 of PCT International Application No. PCT/US2014/069479, filed Dec. 10, 2014, which claims the benefit and priority to U.S. Provisional Application No. 61/915,268, filed Dec. 12, 2013, the contents of which are incorporated herein by reference in their entirety.

STATEMENT OF RIGHTS TO INVENTIONS MADE UNDER FEDERALLY SPONSORED RESEARCH

This invention was made with Government support under SBIR Grant 1353411 awarded by the National Science Foundation. The Government has certain rights to this invention.

BACKGROUND OF THE INVENTION

This invention is directed to an encapsulated quantum dot light emitting diode (QD-LED), and in particular, an encapsulation structure and method of manufacture which promotes a beneficial aging effect in the quantum dot light emitting diode.

Quantum dot light emitting diodes are well known in the art. The basic structure for a bottom-emitting device is a glass substrate and a QD-LED stack which includes a quantum dot light emitting layer, nanoparticle layers and the like. The QD-LED stack is made of sensitive materials and therefore needs to be protected from the environment. As known in the art, protective encapsulation layers are disposed over the sensitive materials as a protective cover. This encapsulation has taken the form of a curable resin.

Loctite 349 curable resin has been used to encapsulate organic LEDs (OLED). Loctite 349 is just one of many curable resins utilized to encapsulate OLED, and has not been used to encapsulate QD-LEDs which are made of inorganic or a combination of inorganic and organic materials. Some QD-LEDs exhibit a "positive aging effect" in which the various efficiencies (current, power or external quantum efficiencies) improve over time. The positive aging effect can be contrasted to degradation of QD-LED's to lower brightness and lower efficiencies, sometimes called the negative aging effects. However, no such positive aging effect has been observed in OLEDs using Loctite 349.

Because the prior art structures do not promote the positive aging effect as defined above, a structure and/or a method of manufacture which further promotes the aging effect is desired.

BRIEF SUMMARY OF THE INVENTION

A QD-LED is manufactured by providing a glass substrate. A QD-LED stack is formed on the substrate. An active reagent; such as an acid is incorporated (diffused) into the QD-LED stack. A curable resin sufficient to encapsulate the QD-LED stack is dropped onto the QD-LED stack and then compressed with a glass cover. The curable resin is then cured with ultraviolet light for about three minutes.

In one embodiment, the acid is an acrylic acid contained in the curable resin. In another embodiment the QD-LED is baked at a temperature of about 50° C. or more for about four hours or more to achieve higher and stable efficiencies.

BRIEF DESCRIPTION OF THE DRAWINGS

The present disclosure is better understood by reading the written description with reference to the accompanying drawings/figures, in which the reference numerals denote the similar structure referred to the elements throughout in which:

FIGS. 6a-6c show the positive aging effect for a red QD-LED utilizing an encapsulation curable resin having different concentrations of Acrylic Acid in—accordance with the invention;

FIGS. 14a-14b show current efficiency as a function of luminance for a plurality of QD-LEDs formed in accordance with the invention with a variety of Acrylic Acid concentrations and heated at 90° C.

DETAILED DESCRIPTION OF THE PREFERRED EMBODIMENT

The inventors have created a method for building an encapsulated QD-LED and resulting structure which promotes the desirable positive aging effect in QD-LED. Applicants found that diffusing a reactive reagent, such as an acid by way of non-limiting example, into the QD-LED stack promotes the positive aging effect for that QD-LED. A preferred method of delivering the acid is by doping an encapsulation layer with an acid; preferably but not limited to Acrylic Acid. By exposing the QD-LED constructed in accordance with the invention to heat, the positive aging effect may be accelerated and stabilized.

Figure 1:
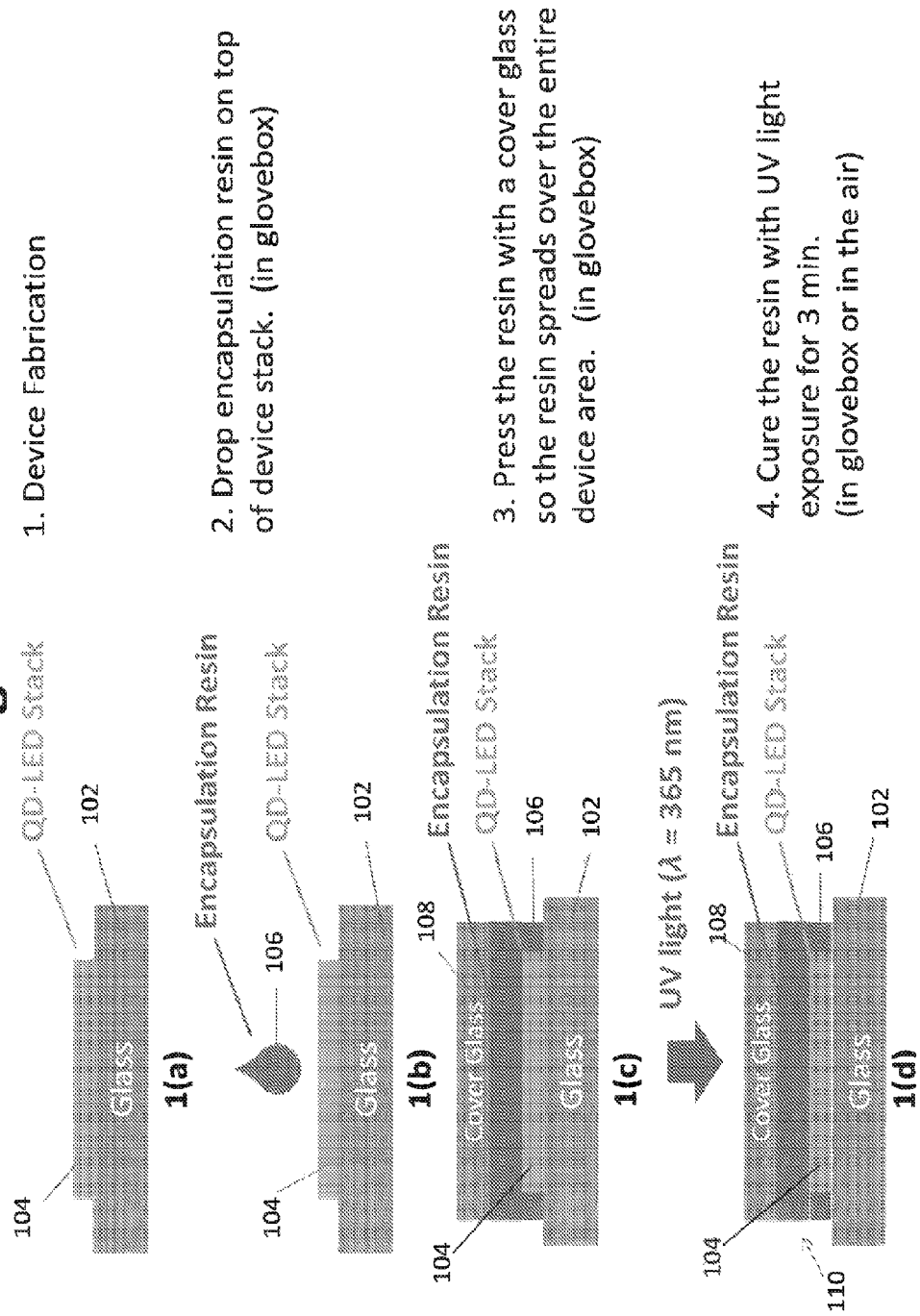
FIG. 1 shows steps in the formation of a QD-LED in accordance with the invention.

More specifically, as shown in FIG. 1, in step 1(a), a glass substrate 102 is provided and a QD-LED stack 104 is deposited thereon as known in the art. A QD-LED stack as known in the prior art will generally include a cathode, electron transport layer, a quantum dot emitting layer, a hole transport layer, a hole injection layer, and an anode. In a step 1(b), an encapsulating curable resin 106 is deposited onto the QD-LED stack to encapsulate the QD-LED stack 104. In a preferred, but non-limiting embodiment, the curable resin is doped with Acrylic Acid at a concentration of about 7.5 percent or more by weight by way of non-limiting example. In step 1(c), a cover glass 108 presses the curable resin droplet 106 to spread over the entire QD-LED stack 104. Steps 1(b) and 1(c) are performed in a glove box. In step 1(d), QD-LED is exposed to ultraviolet light at a wavelength of about 365 nm as known in the art, for about three minutes in the glove box or in air, but for a time period sufficient to cure the curable resin encapsulating a QD-LED 110.

Figure 2:
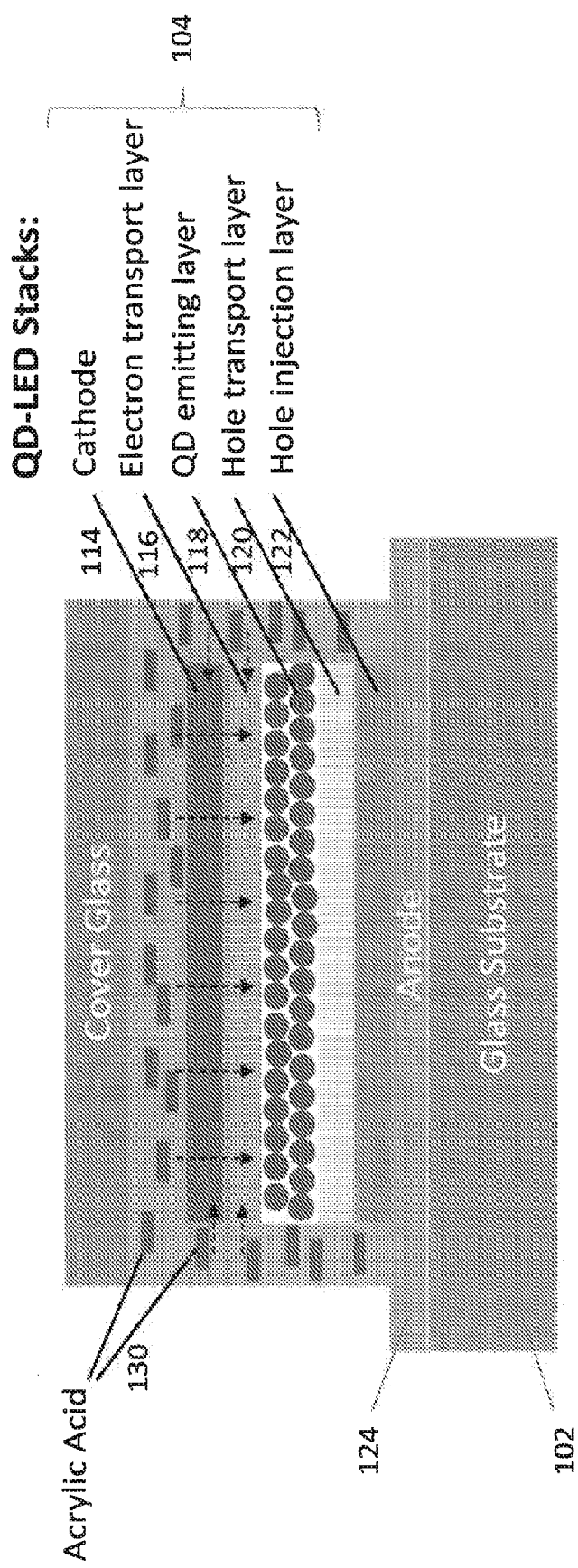
FIG. 2 is a schematic diagram of a QD-LED constructed in accordance with the invention illustrating the diffusion of the Acrylic Acid in accordance with the invention.

Reference is now made to FIG. 2 in which a schematic sectional view of QD-LED constructed in accordance with the invention is provided. QD-LED 110 includes a glass substrate 102, and an anode 122 is disposed on glass substrate 102 as known in the art. As discussed above, a QD-LED stack 104 is assembled on anode 122 and as known in the art, includes a cathode 114, supported by an electron transport layer 116, which in turn is disposed upon a quantum dot emitting layer 118, which in turn is disposed upon a hole transport layer 120, which in turn is disposed on a hole injection layer 122 which lies upon anode 124. QD-LED stack 104 is encapsulated by curable resin 106. As known in the art, at least quantum dot emitting layer 118 is formed of inorganic materials. The curable resin is doped with Acrylic Acid molecules 130 in an amount between 0.1% to 99% by weight, but preferably between 7.5% and 30% by weight. Glass cover plate 108 is provided on the encapsulation curable resin 106 to promote flow of the curable resin 106 about QD-LED stack 104 so that the QD-LED stack 104 is disposed between two glass layers.

In the above embodiment, the Acrylic Acid is delivered by the doped encapsulation layer 106. However, the active reagent may also be diffused by gas phase annealing, solution doping with active reagents, or washing of QD-LED stack 104 with an active reagent solution prior to encapsulation.

As will be demonstrated below, Applicants have discovered that unlike OLEDs, the use of an encapsulating resin doped with Acrylic Acid promotes the positive aging effect in QD-LEDs. The Acrylic Acid molecules 130 is thought to diffuse into the QD-LED stack 104 as simplistically shown for ease of description, by way of non-limiting example, by arrows A and B in FIG. 2. It is believed that the Acrylic Acid molecules 130 interact with the device layers of QD-LED stack 104 and the interfaces between the layers by diffusing through the top and sides of the device layers. It is believed that it is this process which promotes the positive aging effect in QD-LEDs where no such effect was found in OLEDs.

The inventors created a green QD-LED as shown in FIG. 2 and a QD-LED as known in the prior art (without Acrylic Acid in the curable resin) and compared current efficiencies as a function of luminance for the two QD-LEDs. As shown in FIG. 3a, a green QD-LED is formed in accordance with FIG. 1 utilizing an encapsulating resin 106 having about 7.5% Acrylic Acid by weight, by way of example, Loctite 349 manufactured by Henkel Corporation. Luminance was tested each day for four days and current efficiency was determined each day for four days.

Figure 3B:
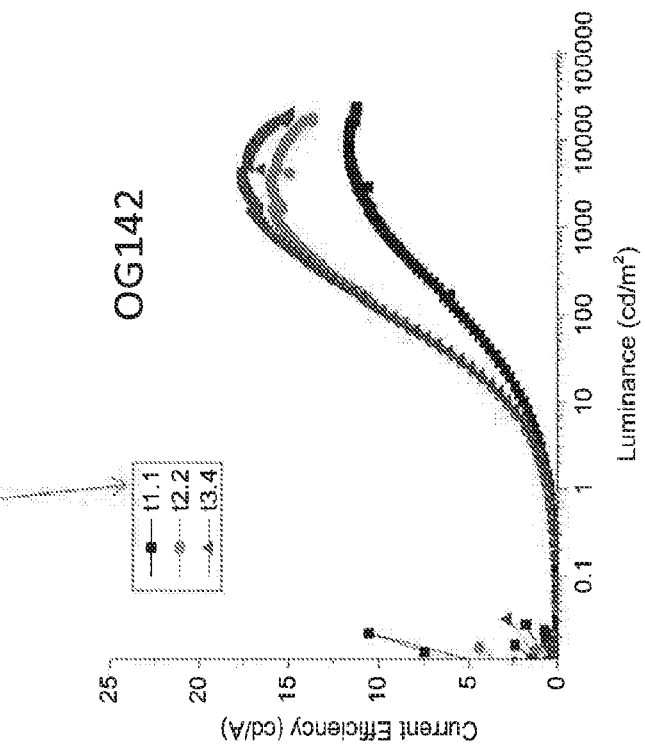
FIGS. 3a and 3b are graphs showing current efficiency as a function of the luminance for a QD-LED having Acrylic Acid doped curable resin\ (FIG. 3a) in accordance with the invention, and a curable resin not doped with Acrylic Acid (FIG. 3b), in accordance with the prior art.
Figure 3A:
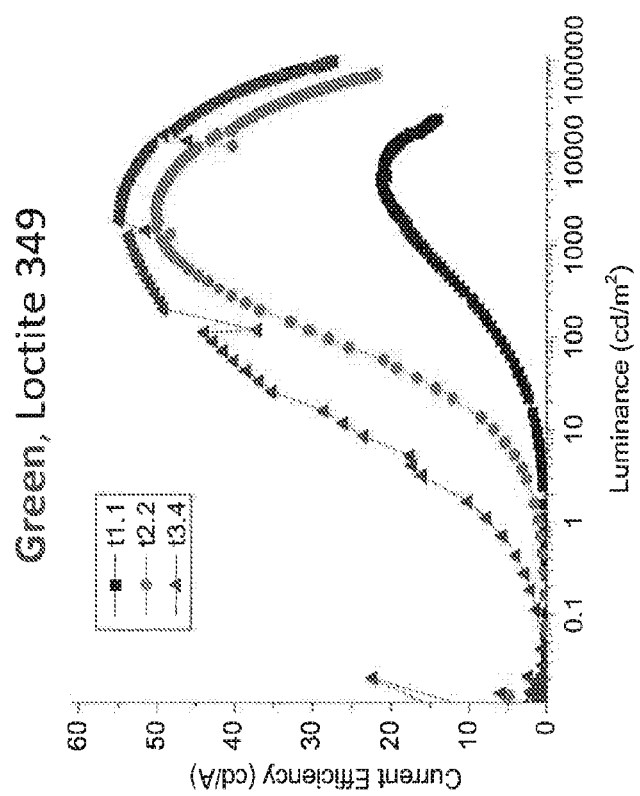

In FIG. 3b, a green QD-LED was constructed utilizing an encapsulation curable resin having no Acrylic Acid therein, by way of non-limiting example, QG142 manufactured by Epoxy Technology, Inc. Again, luminance and current efficiency were determined each day. As can be seen, there is a significant improvement in current efficiency for the green QD-LED formed with an Acrylic Acid doped encapsulating curable resin 106. The current efficiency at a luminescence of 10,000 $cd/m^2$, on the fourth day for the QD-LED constructed in accordance with the invention (FIG. 3a) is more than triple that of the current efficiency for the similarly constructed green QD-LED using a prior art encapsulation resin; without Acrylic Acid (FIG. 3b).

Figure 4:
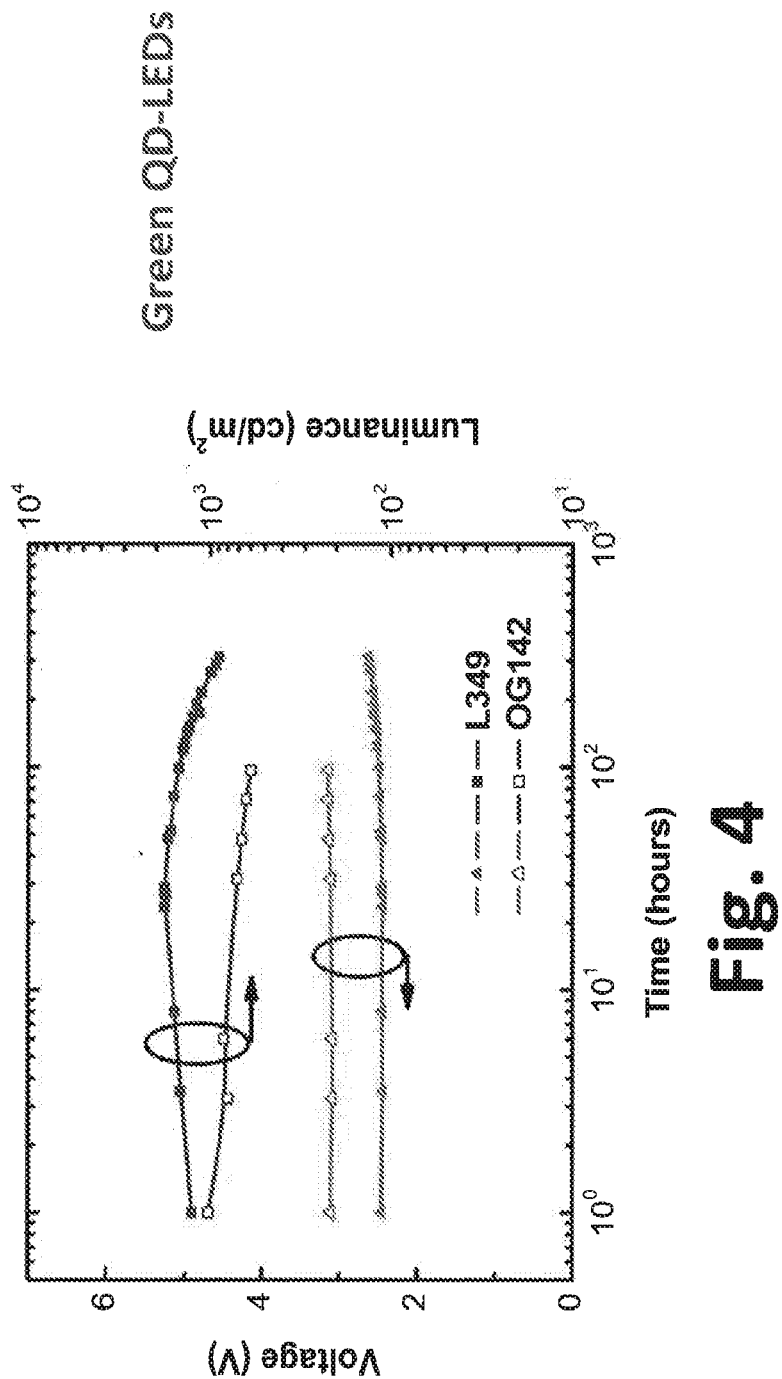
FIG. 4 is a comparison of a QD-LED constructed in accordance with the invention and a prior art QD-LED.

Furthermore, as seen in FIG. 4, the inventors also discovered that the T50 lifetime (negative aging effect) for the QD-LED constructed having an encapsulating curable resin layer 106 doped with Acrylic Acid is significantly greater than the T50 lifetime for the QD-LED having an encapsulation layer that is not doped with Acrylic Acid. The acrylic acid doped QD-LED has a T50 lifetime of about 320 hours. In contrast thereto, the T50 lifetime for the device having an encapsulation layer not doped with Acrylic Acid is less than 100 hours.

As seen in FIGS. 3a, 3b, the current efficiency increases each day over the three to four day period from the device fabrication. This is the exhibition of the positive aging effect in the QD-LED having the Acrylic Acid doped encapsulation layer. The efficiency of the green QD-LED increases from about 20 cd/A on the first day of the test to 55 cd/A by the third day of testing. In contrast, the green QD-LED constructed in accordance with the prior art never reaches a maximum efficiency greater than 20 cd/A.

Figure 5:
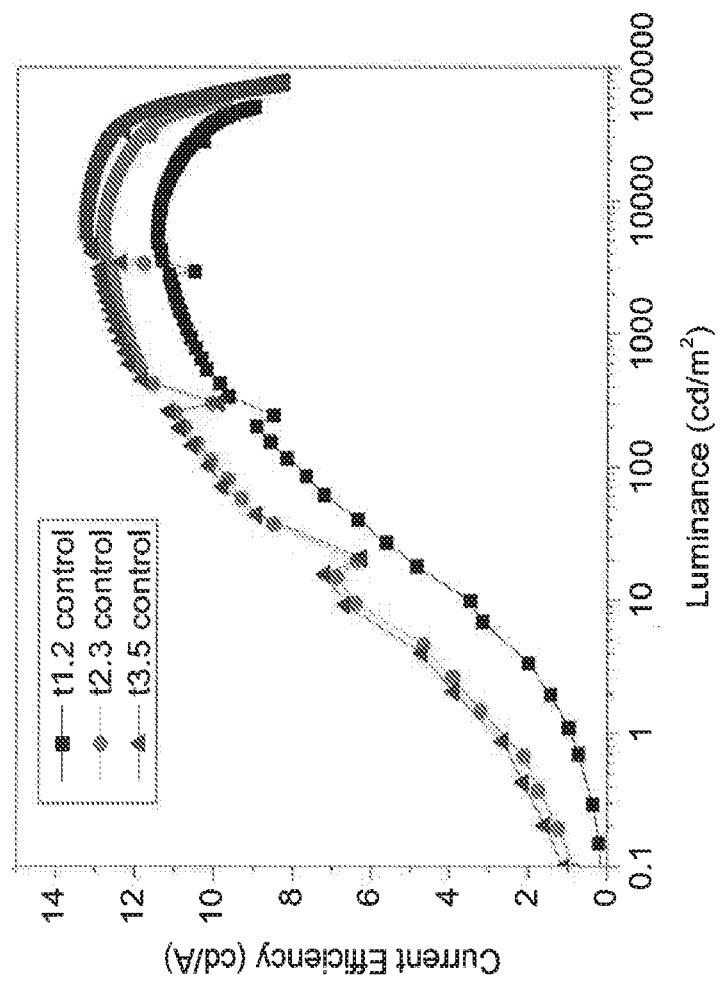
FIG. 5 is a graphical representation of current efficiency as a function of—luminance for red and blue QD-LEDs constructed in accordance with the invention.

The initial comparison between QD-LEDs constructed with Acrylic Acid doped encapsulating layers 106 and the prior art devices was done with a green QD-LED. However, as seen in FIG. 5, the positive aging effect may also be promoted in red and blue QD-LEDs constructed with Acrylic Acid doped encapsulating resin. However, the positive aging effect of the red QD-LED is exhibited to a lesser extent compared to the green QD-LED. The positive aging effect in the blue QD-LEDs is also not as significant as the green QD-LEDs. This is attributable to the relatively fast efficiency degradation known to occur in blue QD-LEDs which counteracts any efficiency increase induced by the positive aging effect.

The effect of different formulations of Acrylic Acid based encapsulation curable resin were studied to confirm that Acrylic Acid is the primary contributor to promoting the positive aging effect in the QD-LED. While the tested curable resin for the QD-LED constructed in accordance with the invention was known to contain Acrylic Acid as compared to the prior art encapsulation resin (OG142), a series of studies were performed to confirm and determine the contributing factor(s) to promoting the positive aging effect with QD-LEDs. Accordingly, as seen in FIGS. 6a-6c red QD-LEDs were constructed with various formulations utilizing known Acrylic Acid resins of 7.5%, 15%, 23%, respectively. As can be seen in FIGS. 6a-6c that even with different formulations, the positive aging effect was experienced to varying degrees in each QD-LED at three days from fabrication. In other words, the current efficiency as a function of luminance substantially increased by the third day after encapsulation for all Acrylic Acid formulations tested.

Figure 7B:
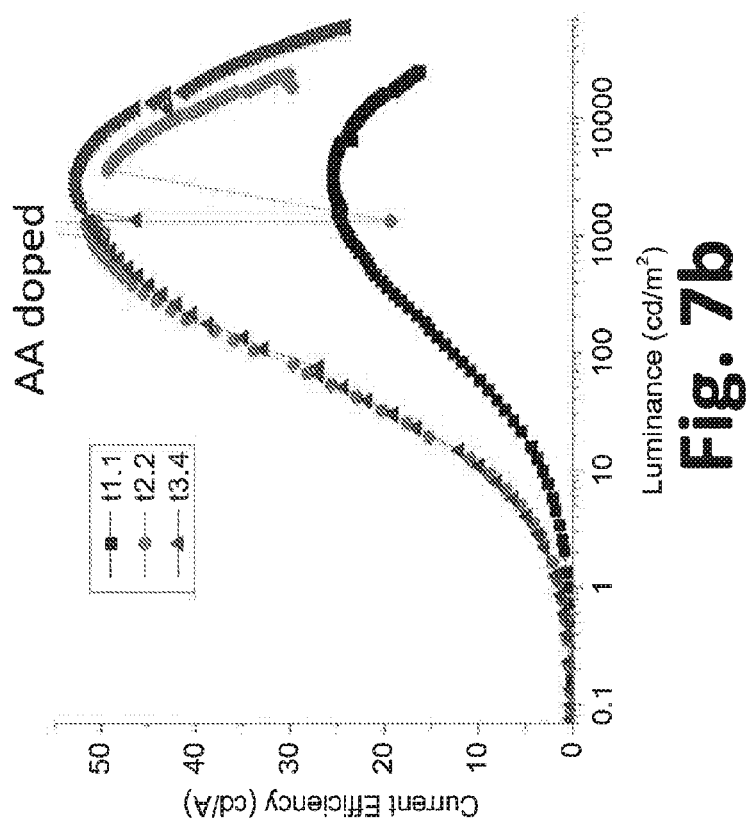
FIGS. 7a-7b show a comparison of current efficiency as a function of luminescence for QD-LEDs encapsulated in a curable resin being doped with Methyl Methacrylate (FIG. 8a) and an encapsulation curable resin doped with poly-Acrylic Acid (FIG. 8b) in accordance with the invention.
Figure 7A:
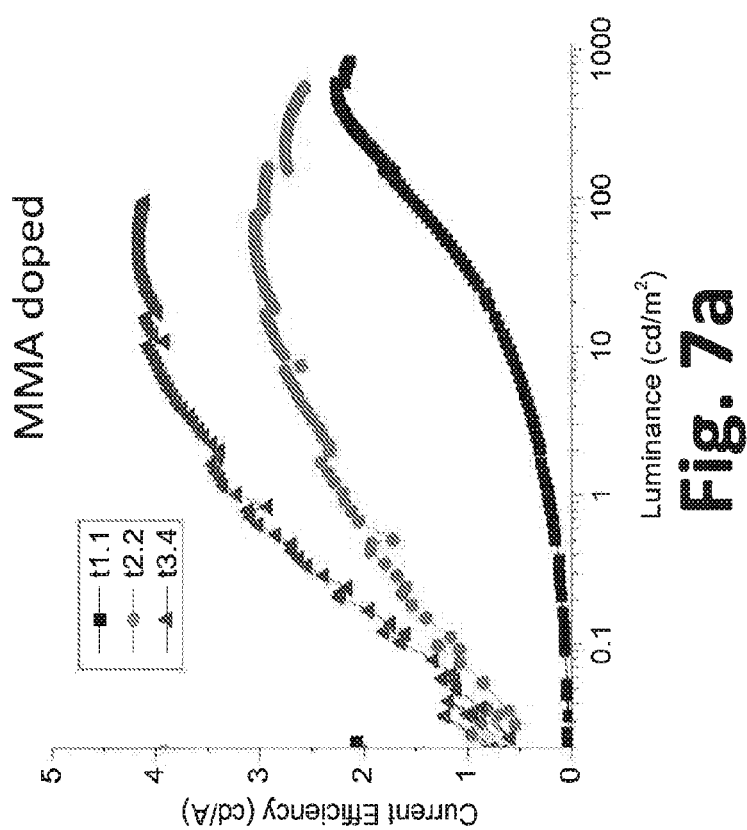

In order to confirm what factor promoted the positive aging effect, the inventors further studied formulations. The inventors discovered at least one difference between the formulation that promoted the positive aging effect and prior art encapsulation material (OG142) is that the OG142 resin did not include Acrylic Acid or Methyl Methacrylate (MMA). Accordingly, as seen in FIGS. 7a and 7b, green QD-LEDs having MMA doped encapsulation layers (FIG. 7a) were compared to green QD-LEDs having an Acrylic Acid doped encapsulation layer. As seen when comparing FIGS. 7a to 7b, the QD-LEDs with the Acrylic Acid doped encapsulation layer show improved current efficiency which are greater than ten times the current efficiencies exhibited by the same green QD-LED structure having an MMA doped encapsulation layer. This confirms that the addition of Acrylic Acid to the encapsulation layer promotes the positive aging effect.

After confirmation that Acrylic Acid doped encapsulation layers promote the positive aging effect, formulations were tested. The inventors created a QD-LED having an encapsulation layer containing 7.5% Acrylic Acid by weight, a second QD-LED having an encapsulation layer which is 15% Acrylic Acid by weight; a third QD-LED having an encapsulation layer which is 23% Acrylic Acid by weight and a fourth QD-LED having an encapsulation layer which is 30% Acrylic Acid by weight, a fifth QD-LED was formed in accordance with the invention as described in FIG. 1 doped with Acrylic Acid of 23% by weight, and additionally baked at 50° C. for 18 hours.

Figure 8A:
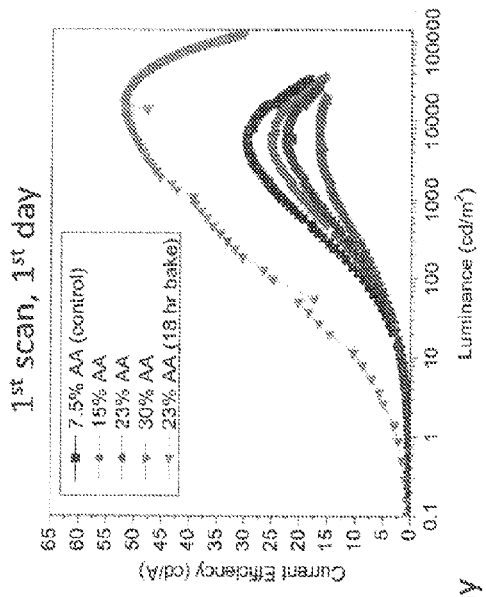
FIGS. 8a-8c show the current efficiency as a function of luminescence over time for QD-LEDs constructed in accordance with the invention.
Figure 8C:
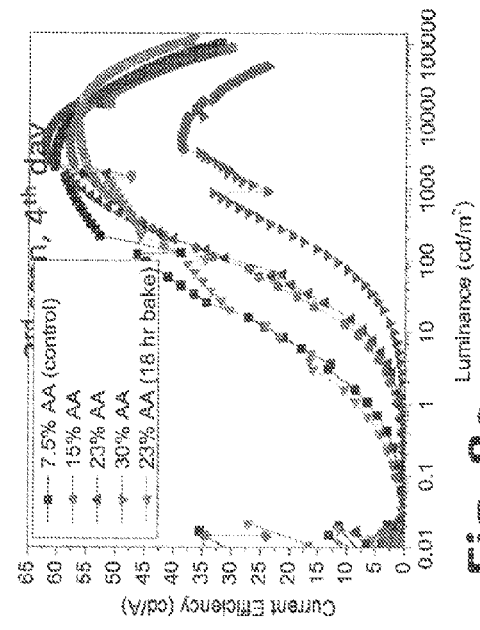
Figure 8B:
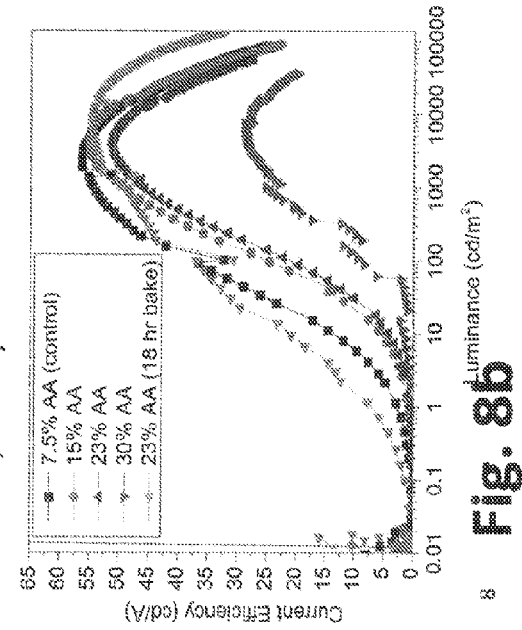

As seen in FIGS. 8a-8c, representing current efficiency as tested on the first day, third day and fourth day respectively, the positive aging effect occurs in those QD-LEDs having Acrylic Acid doped encapsulation layers of 7.5%, 15% and 23%. They all reach the same general maximum current efficiency. However, the QD-LED having encapsulation layer doped with 30% Acrylic Acid by weight actually showed no positive aging effect. The maximum efficiency is decreased. Furthermore, as seen in FIG. 8a, baking the QD-LED accelerates the time period in which the positive aging effect is realized. The baked QD-Led reached its maximum efficiency in the first day, while it took three to four days for the remaining QD-LED to attain their maximum current efficiency. A summary of the results is shown in Table 1 below where t1.1 designates aging for one day, t2.3 for 2 to 3 days, and t3.4 for 3 to 4 days.

TABLE 1

| Additive | CE t1.1 (cd/A) | CE t2.3 (cd/A) | CE t3.4 (cd/A) |
| --- | --- | --- | --- |
| Control | 29.6 | 56.3 | 60.4 |
| 15% AA | 25.2 | 55.3 | 58.0 |

TABLE 1-continued

| Additive | CE t1.1 (cd/A) | CE t2.3 (cd/A) | CE t3.4 (cd/A) |
| --- | --- | --- | --- |
| 23% AA | 22.4 | 50.9 | 62.1 |
| 23% AA with 18 hr bake | 52.0 | 54.4 | 56.7 |
| 30% AA | 16.5 | 28.5 | 38.8 |

Figure 9B:
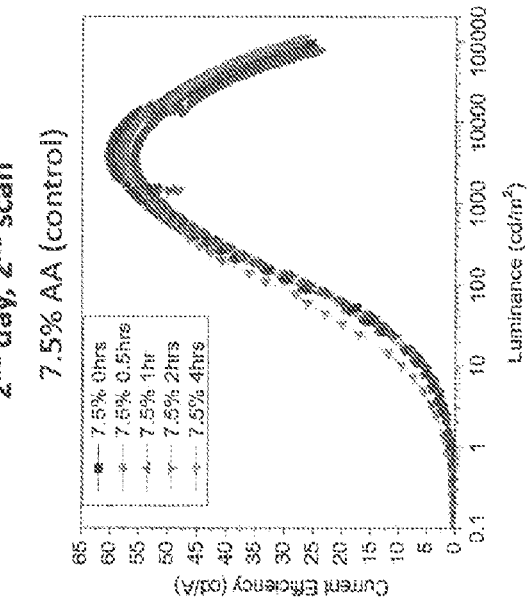
FIGS. 9a-9b are graphs showing current efficiency, at two points in time, for QD-LEDs constructed in accordance with the invention in which the encapsulation curable resin has 7.5% Acrylic Acid by weight in accordance with the invention.
Figure 9A:
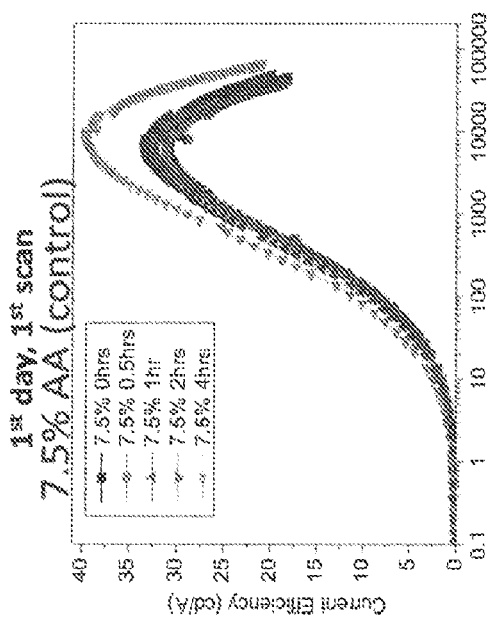
Figure 10B:
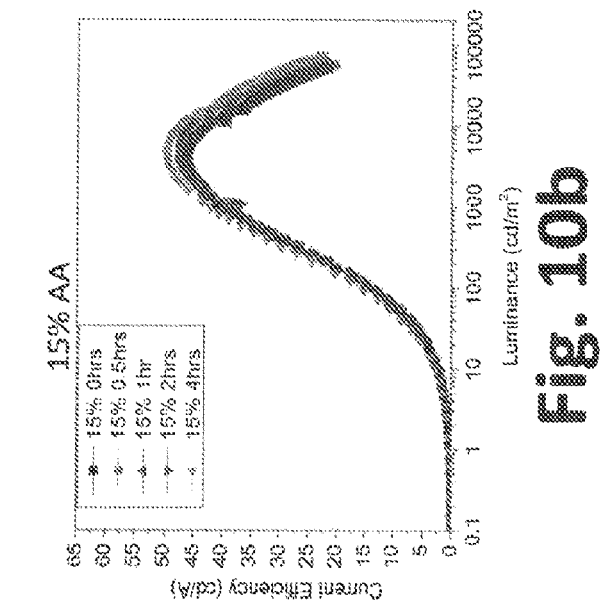
FIGS. 10a-10b are graphs showing current efficiency, at two points in time, for QD-LEDs constructed in accordance with the invention in which the encapsulation curable resin has 15% Acrylic Acid by weight in accordance with the invention.
Figure 10A:
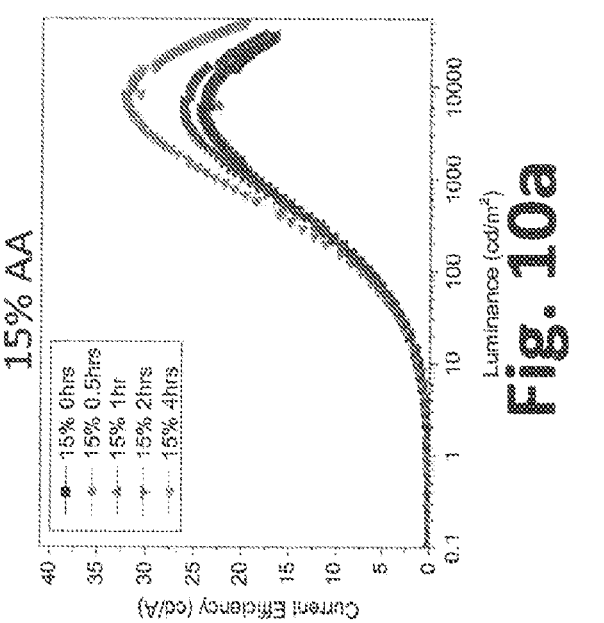
Figure 11B:
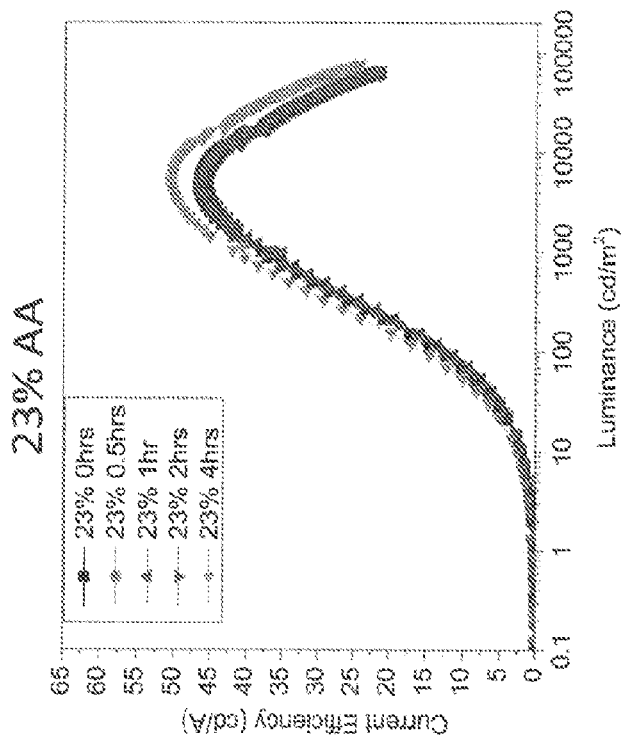
FIGS. 11a-11b are graphs showing current efficiency, at two points in time, for QD-LEDs constructed in accordance with the invention in which the encapsulation curable resin has 23% Acrylic Acid by weight in accordance with the invention.
Figure 11A:
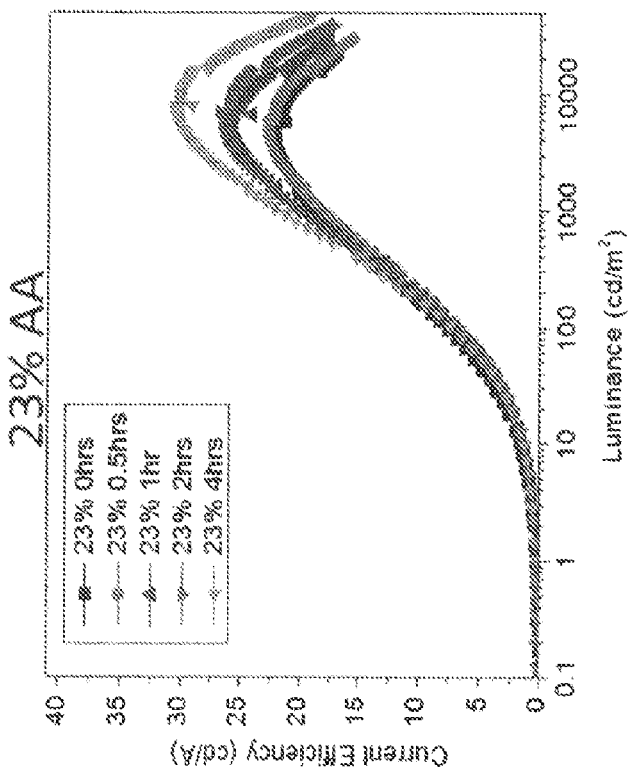

To confirm that baking (heating the QD-LED over time) at fabrication, promotes the positive aging factor, QD-LEDs were constructed in which the encapsulated layer was doped with different amounts of Acrylic Acid and then baked for anywhere from one-half hour to four hours and compared to a control QD-LED which is not baked. Reference is made to FIGS. 9a and 9b in which the positive aging effect is shown over time after baking for a QD-LED having an encapsulation layer containing 7.5% Acrylic Acid by weight. A significant increase in current efficiency is produced by the second day, particularly for that QD-LED which is baked for four hours. Little difference is seen when the control (baked for 0 hours) is compared to devices baked for one-half hour, one hour or two hours. Similarly, as seen in FIGS. 10a and 10b, for the QD-LEDs having encapsulation layers of 15% Acrylic Acid by weight, baking for four hours significantly increases the current efficiency in the first day. The same is true for QD-LEDs having 23% by weight Acrylic Acid doped encapsulation layers as seen in FIGS. 11a and 11b. Those QD-LEDs baked the longest show the quickest exhibition of the positive aging effect as seen in FIG. 11a. Tables 2-4 summarize the results below:

TABLE 2

| Additive | CE t1.1 (cd/A) | CE t2.2 (cd/A) |
| --- | --- | --- |
| 7.5% AA | 30.8 | 58.8 |
| 7.5% AA 0.5 hrs | 31.0 | 59.0 |
| 7.5% AA 1 hr | 33.3 | 60.2 |
| 7.5% AA 2 hrs | 32.5 | 55.9 |
| 7.5% AA 4 hrs | 39.6 | 57.4 |

TABLE 3

| Additive | CE t1.1 (cd/A) | CE t2.2 (cd/A) |
| --- | --- | --- |
| 15% AA | 24.0 | 46.6 |
| 15% AA 0.5 hrs | 24.0 | 46.1 |
| 15% AA 1 hr | 24.3 | 45.4 |
| 15% AA 2 hrs | 26.4 | 47.8 |
| 15% AA 4 hrs | 32.3 | 48.8 |

TABLE 4

| Additive | CE t1.1 (cd/A) | CE t2.2 (cd/A) |
| --- | --- | --- |
| 23% AA | 22.1 | 46.9 |
| 23% AA 0.5 hrs | 22.7 | 46.6 |
| 23% AA 1 hr | 25.9 | 45.4 |
| 23% AA 2 hrs | 26.6 | 46.6 |
| 23% AA 4 hrs | 30.6 | 50.6 |

Figures 12A, 12B:
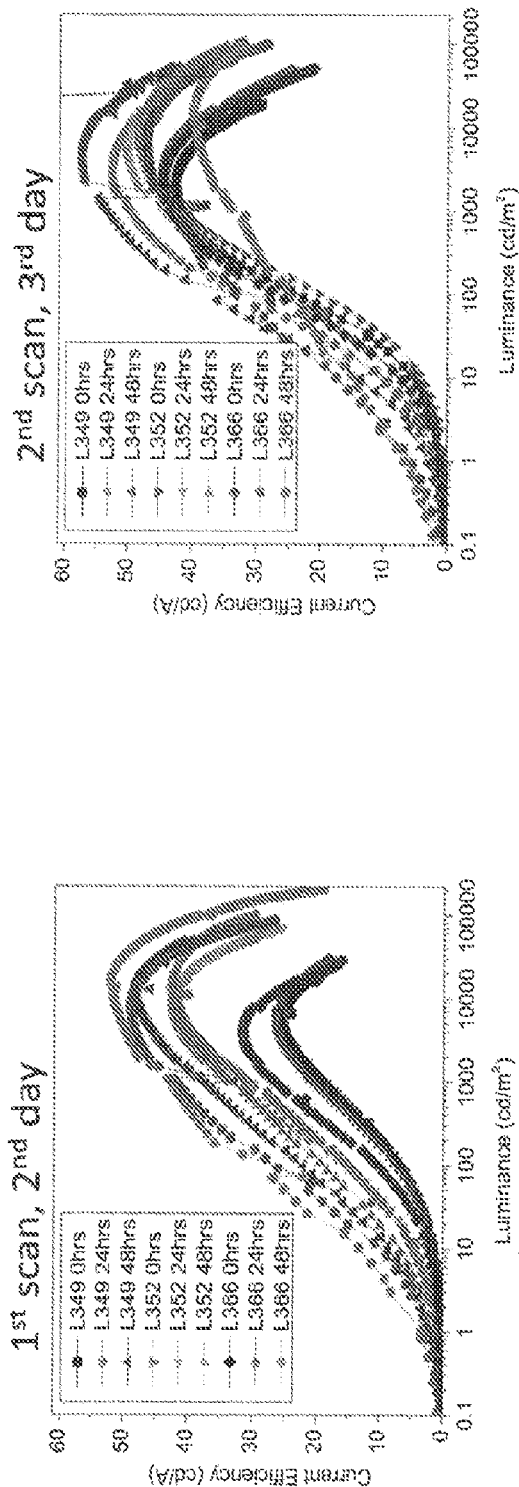
FIGS. 12a-12b show current efficiency as a function of luminance for a plurality of QD-LEDs formed in accordance with the invention with a variety of Acrylic Acid concentrations and exposed to heat over time.
Figure 13B:
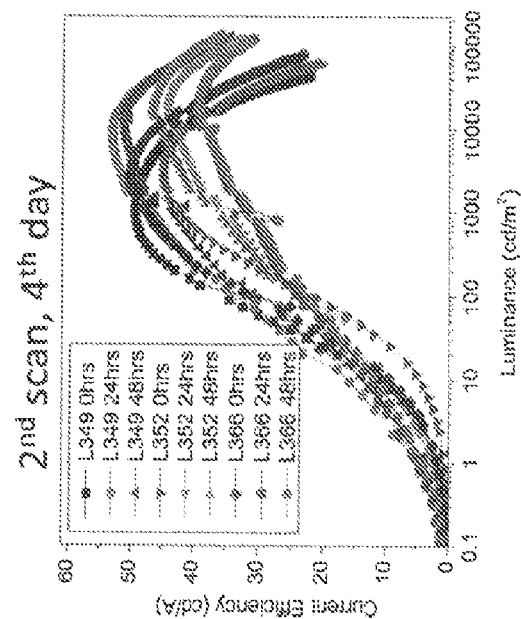
FIGS. 13a-13b show current efficiency as a function of luminance for a plurality of QD-LEDs formed in accordance with the invention with a variety of Acrylic Acid concentrations and heated at 70° C.
Figure 13A:
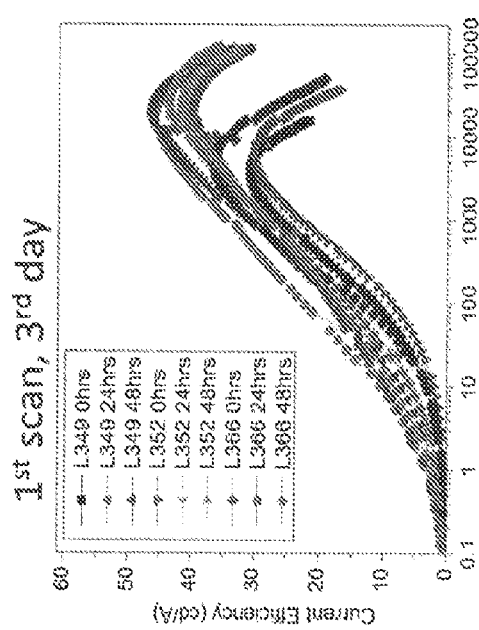
Figure 15B:
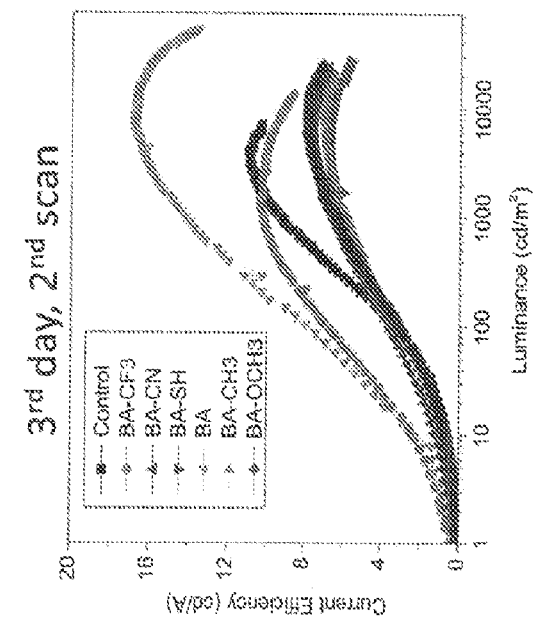
FIGS. 15a-15b are graphs showing the current efficiency as a function of luminance for a QD-LED in which the encapsulating curable resin is doped with a variety of additives as a control.
Figure 15A:
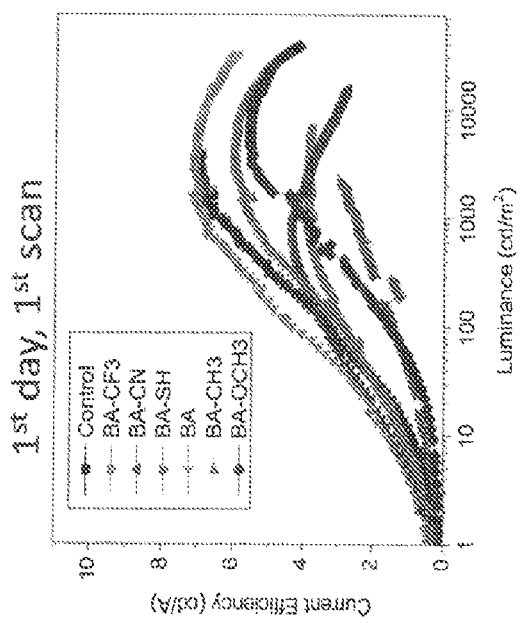

Having determined that baking can accelerate the aging process, the inventors performed studies to determine whether baking temperature would further affect the acceleration of the aging process. QD-LEDs having an encapsulation layer having 7.5%, 15% and 23% Acrylic Acid by weight, were baked at fabrication for 0 hours, 24 hours and 48 hours. One sample was baked at 50° C. for the time periods, one at 70° C. for the time periods, and one at 90° C. for the time periods. The results confirmed that in a preferred, but non-limiting embodiment, the QD-LED should be baked for 50° C. for 24 hours in order to maximize throughput for QD-LED while promoting an accelerating aging process in the QD-LED. As seen in FIGS. 12a, and 12b, the current efficiencies maximized for the QD-LEDs baked for 48 hours as compared to 24 hours when tested on the second day. However, the increment for baking an additional 24 hours is not nearly as significant as the increase in current efficiency compared to baking for 24 hours when compared with baking for 0 hours. In each instance, the first 24 hours of baking at 50° C. resulted in over 50% increase in current efficiency, whereas an additional 24 hours of baking resulted in an additional 10% to 20% increase in current efficiency. The results are summarized in Table 5 below.

TABLE 5

| Encapsulant and bake time | CE t1.2 (cd/A) | CE t2.3 (cd/A) |
| --- | --- | --- |
| Loctite 349 0 hrs | 25.4 | 42.5 |
| Loctite 349 24 hrs 50 C. | 41.7 | 52.7 |
| Loctite 349 48 hrs 50 C. | 48.2 | 57.3 |
| Loctite 352 0 hrs | 26.6 | 44.6 |
| Loctite 352 24 hrs 50 C. | 42.5 | 50.3 |
| Loctite 352 48 hrs 50 C. | 42.6 | 48.4 |
| Loctite 366 0 hrs | 31.4 | 44.5 |
| Loctite 366 24 hrs 50 C. | 48.9 | 47.0 |
| Loctite 366 48 hrs 50 C. | 52.1 | 39.9 |

When the temperature was increased to 70° C. and sampled on the third and fourth day, the positive aging effect was promoted, but not to the same extent as for baking at 50° C. as seen by comparing 0 hours of baking with the initial 24 hours of baking, both in Table 6 below and comparing the results of 50° C. as shown in Table 5 for the same test.

TABLE 6

| Encapsulant and bake time | CE t1.3 (cd/A) | CE t2.4 (cd/A) |
| --- | --- | --- |
| Loctite 349 0 hrs | 30.7 | 49.5 |
| Loctite 349 24 hrs 70 C. | 46.0 | 53.2 |
| Loctite 349 48 hrs 70 C. | 46.4 | 51.2 |
| Loctite 352 0 hrs | 30.2 | 45.2 |
| Loctite 352 24 hrs 70 C. | 41.2 | 44.4 |
| Loctite 352 48 hrs 70 C. | 43.8 | 46.8 |
| Loctite 366 0 hrs | 86.4 | 50.2 |
| Loctite 366 24 hrs 70 C. | 39.8 | 39.4 |
| Loctite 366 48 hrs 70 C. | 41.8 | 39.6 |

Similarly, baking the QD-LEDs at 90° C. did not show significant improvement when compared to 70° C. as seen in FIGS. 14a, 14b, and summarized in Table 7 below. Again, there was a significant increase between baking for at least 24 hours; while the additional 24 hours (for a total of 48 hours) did not show an equally significant increase in the positive aging effect and did not show a significantly appreciable promotion of the positive aging effect when compared to the more energy efficient baking at 50° C. Results of baking the QD-LEDs at 90° C. are summarized in Table 7 below.

TABLE 7

| Encapsulant and bake time | CE t1.3 (cd/A) | CE t2.4 (cd/A) |
| --- | --- | --- |
| Loctite 349 0 hrs | 32.0 | 47.4 |
| Loctite 349 24 hrs 90 C. | 45.2 | 50.9 |
| Loctite 349 48 hrs 90 C. | 44.1 | 51.8 |
| Loctite 352 0 hrs | 30.8 | 49.8 |
| Loctite 352 24 hrs 90 C. | 44.3 | 43.7 |
| Loctite 352 48 hrs 90 C. | 45.9 | 44.8 |
| Loctite 366 0 hrs | 37.5 | 51.0 |
| Loctite 366 24 hrs 90 C. | 48.3 | 42.5 |
| Loctite 366 48 hrs 90 C. | 45.1 | 39.9 |

In a preferred non-limiting embodiment in order to maximize throughput and energy costs, the optimized baking conditions would be 50° C. for 24 hours.

To test whether Acrylic Acid was unique in promoting the positive aging effect, the inventors doped curable resins with benzoic acid (BA) and different types of BAderivatives. QD-LEDs were formed utilizing the methodology of FIG. 1, without baking. However, rather than doping the encapsulating curable resin with Acrylic Acid, a prior art non-Acrylic Acid resin was used as a control and various benzoic acids derivatives were used to dope the encapsulating curable resin. As seen in FIGS. 14a and 14b, on the second day the current efficiency for sample BA was 60% greater than for the control sample, while the current efficiencies for all other sample were approximately equal to or less than that of the control sample for each embodiment on both the first and second day. These data suggest that doping with acids other than acrylic acids can lead to a positive aging effect. However, the embodiment of the invention using acrylic acid, shown in FIG. 3a and in FIGS. 14a, 14b provide the largest improvements. The results with various acids are summarized in Table 8 below.

TABLE 8

| Additive | CE t1.1 (cd/A) | CE t2.3 (cd/A) |
| --- | --- | --- |
| Control | 6.9 | 10.9 |
| BA-CF$_3$ | 3.9 | 10.3 |
| BA-CN | 4.3 | 7.6 |
| BA-SH | 2.9 | 6.7 |
| BA | 7.1 | 16.8 |
| BA-CH$_3$ | 6.0 | 7.0 |
| BA-OCH$_3$ | 5.5 | 7.8 |

Accordingly, by forming a QD-LED with encapsulation layer having an active reagent therein, the positive aging effect is promoted. In other words, much greater current efficiencies are obtained than previously known. Furthermore, by baking the QD-LED at temperatures of about 50° C. or higher, for up to 48 hours from fabrication, the aging process may be accelerated and stabilized while Acrylic Acid and Benzoic Acid promote the beneficial aging effect as shown, in other embodiments, the active reagent may include one or more of methacrylic acid, 3-butenoic acid, crotonic acid and other unsaturated carboxylic acid derivatives; acetic acid, propionic acid, butyric acid, isobutyric acid and other saturated carboxylic acid derivatives.

While there have been shown, described, and pointed out, novel features of the present invention, as applied to preferred embodiments thereof, it will be understood that various submissions and substitutions and changes in the form and detail are contemplated to the disclosed invention, which may be made by those skilled in the art without departing from the spirit and scope of the invention. It is the intention therefore, to be limited, only as indicated by the scope of the claims appended hereto. It is also be understood that the following claims are intended to cover all of the generic and specific features of the invention herein described and all states of the scope of the invention which, as a matter of language might be said to fall therebetween.

The invention claimed is:

1. A method for fabricating a high efficiency and stable QD-LED, comprising the steps of:
   providing a glass substrate;
   forming a QD-LED stack upon the glass substrate; incorporating an active reagent into a curable resin; encapsulating the QD-LED stack in the curable resin; and curing the curable resin with UV light.

2. The method of claim 1, wherein the curable resin is formed by mixing the active reagent into the curable resin.

3. The method of claim 1, wherein the active reagent includes at least one of acrylic acid, benzoic acid, methacrylic acid, 3-butenoic acid, crotonic acid and other unsaturated carboxylic acid derivatives.

4. The method of claim 1, wherein the active reagent includes at least one of acetic acid, propionic acid, butyric acid, isobutyric acid and other saturated carboxylic acid derivatives.

5. The quantum dot light emitting diode of claim 1, wherein the curable resin is pressed upon the QD-LED stack with a cover glass.

6. The method of claim 1 wherein the QD-LED is baked for a predetermined time period after fabrication.

7. The method of claim 6, wherein the QD-LED is baked at a temperature of at least 50° C.

8. The method of claim 6, wherein the QD-LED is baked at a temperature no more than 90° C.

9. The method of claim 6, wherein the predetermined time period is at least four hours.

10. The method of claim 6, wherein the predetermined time period is no more than forty-eight hours.

11. A method for synthesizing a high efficiency and stable QD-LED, comprising the steps of:
   providing a glass substrate;
   forming a QD-LED stack upon the glass substrate; incorporating an active reagent into the QD-LED stack; encapsulating the QD-LED stack in a curable resin; and curing the curable resin with UV light.

12. A method for fabricating a high efficiency and stable QD-LED, comprising the steps of:
   providing a glass substrate;
   forming a QD-LED stack upon the glass substrate; incorporating an active reagent into the QD-LED stack; encapsulating the QD-LED stack in a curable resin; and curing the curable resin with UV light.

13. A QD-LED formed by:
   providing a glass substrate;
   forming a QD-LED stack upon the glass substrate;
   incorporating an active reagent into the QD-LED stack; encapsulating the QD-LED stack in a curable resin; and curing the curable resin with UV light.

14. A quantum dot light emitting diode comprising:
   a glass substrate;
   a QD-LED stack formed on the glass substrate, the QD-LED stack being diffused with a active agent;
   an encapsulation layer, encapsulating the QD-LED stack, the encapsulation layer being a curable resin.

15. The quantum dot light emitting diode of claim 14, wherein the active reagent includes at least one of acrylic acid, benzoic acid, methacrylic acid, 3-butenoic acid, crotonic acid and other unsaturated carboxylic acid derivatives.

16. The QD-LED of claim 15, wherein the acid is acrylic acid.

17. The QD-LED of claim 16, wherein the encapsulation layer has at least 7.5% acrylic acid by weight.

18. The quantum dot light emitting diode of claim 16, wherein the encapsulating layer has less than 30% acrylic acid by weight.

19. The quantum dot light emitting diode of claim 14, wherein the active reagent includes at least one of acetic acid, propionic acid, butyric acid, isobutyric acid and other saturated carboxylic acid derivatives.

20. The quantum dot light emitting diode of claim 14, the encapsulation layer contains the acrylic acid, the QD-LED includes a hole injection layer, a hole transfer layer disposed on the hole injection layer, a quantum dot emitting layer disposed on the hole transport layer, the electron transport layer disposed on the quantum dot emitting layer, and a cathode disposed on the electron transport layer, and the acrylic acid is diffused from the encapsulation layer into the QD-LED quantum stack.

* * * * *